United States Patent [19]  
Cammarano et al.

[11] 4,360,289  
[45] Nov. 23, 1982

[54] PIN FOR BRAZING TO A SUBSTRATE AND IMPROVED PACKAGE RESULTING THEREFROM

[75] Inventors: Armando S. Cammarano, Hyde Park; Giulio DiGiacomo, Poughkeepsie, both of N.Y.

[73] Assignee: International Business Machines Corporation, Armonk, N.Y.

[21] Appl. No.: 164,643

[22] Filed: Jun. 30, 1980

[51] Int. Cl.³ .................. B25G 3/34; F16B 11/00; F16B 12/04; F16L 13/00
[52] U.S. Cl. .................................... 403/272; 403/270; 403/406; 228/168
[58] Field of Search ............... 403/265, 268, 270, 272, 403/406; 228/168

[56] References Cited  
U.S. PATENT DOCUMENTS

| | | | |
|---|---|---|---|
| 2,163,209 | 6/1939 | Pungel | 403/270 X |
| 2,413,370 | 12/1946 | Palmer | 403/271 |
| 2,563,107 | 8/1951 | Fanger | 403/271 X |
| 2,638,525 | 5/1953 | Candy | 403/268 X |
| 2,858,414 | 10/1958 | Dash | 403/272 X |
| 4,115,019 | 9/1978 | Swisher | 403/270 |
| 4,130,751 | 12/1978 | Gordon | 403/270 X |

Primary Examiner—Wayne L. Shedd  
Attorney, Agent, or Firm—Edward S. Gershuny

[57] ABSTRACT

A pin designed to be attached to a solid state module for making connection between the module and other parts of a metallurgical system. The end of the pin that is to be brazed to the module has a sloping (e.g., conical or wedge) shaped head so that gas bubbles can readily escape during brazing, thus reducing voids in the braze.

2 Claims, 4 Drawing Figures

PIN FOR BRAZING TO A SUBSTRATE AND IMPROVED PACKAGE RESULTING THEREFROM

INTRODUCTION

This invention relates to pins which are brazed to a solid state module to provide connection between the module and other parts of an electrical system. More particularly, the invention relates to an improved pin design which reduces the formation of voids in the braze, thereby providing an improved brazed joint.

In the manufacture of solid state components, pins that are typically made of Kovar are brazed to a substrate in order to provide electrical and/or mechanical contact between the substrate and other parts of an electrical system. The brazed joint between the pin and the substrate is a potential source of mechanical and electrical failure. It has been found that the potential for mechanical failure of the brazed joint is increased by the presence of voids in the brazing compound between the end of the pin and the surface of the module. Such voids result from gases within the molten braze that were unable to escape before the braze solidified. The voids form an easy path for propagation of cracks within the braze leading to failure of the brazed joint.

SUMMARY OF THE INVENTION

It is an object of this invention to provide an improved pin for attachment to a solid state module.

A more particular object of the invention is to provide an improved pin which, when it is brazed to a module, will result in a structure with fewer voids in the brazed joint.

Another object is to provide such a pin without significantly impacting the manufacturing process by which modules are produced.

In accordance with a preferred embodiment of the invention, a pin is provided with a sloped (e.g., conical or wedge shaped) head at the end that will be brazed to a module. The slope at the pin head is sufficient to permit bubbles trapped in the braze to "float" out of the braze while it is in its liquid state.

The primary advantage of this invention is that its use will reduce voids in the brazed joint between a pin and a module, resulting in a structure of increasing mechanical durability.

A secondary advantage of the invention is that the shape of the improved pin can be butted directly against the substrate during brazing, thus obviating the need to control the spacing between the pin head and the module.

BRIEF DESCRIPTION OF THE DRAWINGS

In the accompanying drawings forming a material part of this disclosure.

DETAILED DESCRIPTION

For further comprehension of the invention, and of the objects and advantages thereof, reference is made to the following description and accompanying drawings, and to the appended claims in which the various novel features of the invention are more particularly set forth.

Figure 1:
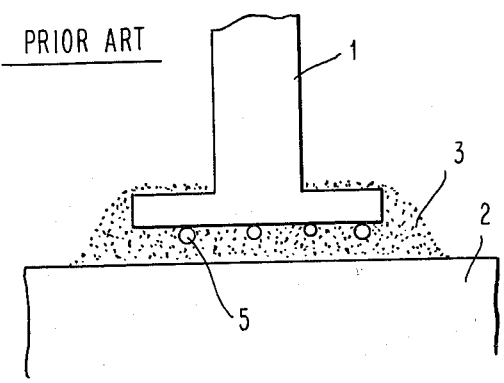
FIG. 1 is a schematic view of a solid state module and a prior art pin.

FIG. 1 shows a prior art pin 1 that is brazed to a substrate 2 by a brazing compound 3. The purpose of the pin may be to provide an electrical contact between a pad (not shown) on the surface of the substrate and other parts of an electrical system, or it may be used to provide mechanical contact (e.g., for mounting purposes) between the substrate 2 and other parts of a larger system, or a combination of the two. The pin typically is made of Kovar and is about 0.4 mm in diameter. The space between pin 1 and the substrate 2 is typically about 0.07 mm, said space being filled by the braze material, which is typically a combination of gold and tin. Where the braze material contacts the surface of substrate 2, the surface of the substrate must comprise a material that is wettable by the braze. This, of course, is well known to those skilled in the art and need not be further described herein.

Figure 2:
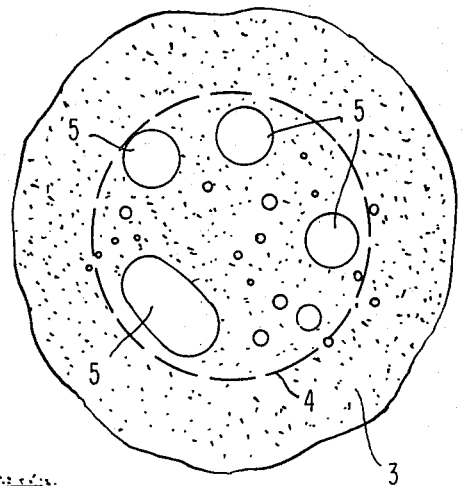
FIG. 2 illustrates a view taken through the braze between a prior art pin and a module, showing voids contained therein.

Referring now to FIG. 2, there is shown a section through the braze material 3 between a prior art pin and a substrate. The broken line 4 shows the area of the braze material that was between the pin head and the substrate. Note that within this area there are a number of voids 5 in the braze material 3. These voids (which are also shown in FIG. 1) are the result of gas bubbles that were trapped under the pin head when the braze was in its molten state. These voids represent a significant source of potential failure of the mechanical joint between the pin and the substrate.

Figure 3:
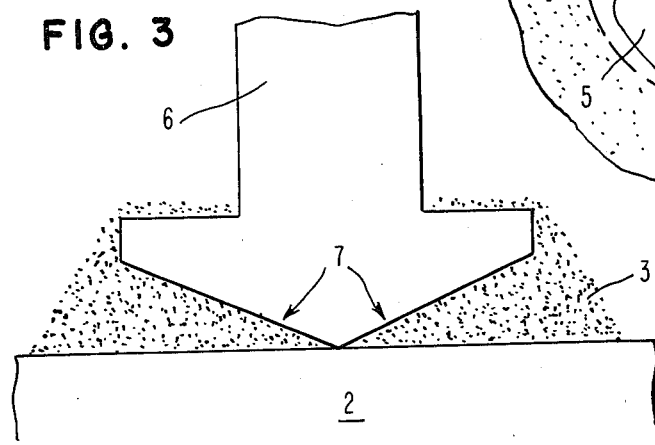
FIG. 3 illustrates the preferred embodiment of this invention.

Referring now to FIG. 3, there is shown our improved pin 6 brazed to a substrate 2 by brazing material 3. The improvement is that the head of the pin at the end which will be brazed to the substrate, instead of being flat as in the prior art, is inclined with respect to the surface of the substrate. In a first preferred embodiment of the invention, this incline is provided by making the head of the pin conical in shape. As shown in FIG. 3, the apex of the cone is in direct contact with substrate 2. The inclined sides 7 of the cone are preferably long enough to extend beyond the area of the body of pin 6 so that the total volume between the head of pin 6 and the substrate 2 will be comparable to the volume between the head of pin 1 and substrate 2 shown in FIG. 1. This is desirable in order to have a sufficient volume of braze material between the pin head and the substrate. Except for this head of pin 6, the remainder of the pin is preferably identical in size to the prior art pin 1 shown in FIG. 1.

Figure 4:
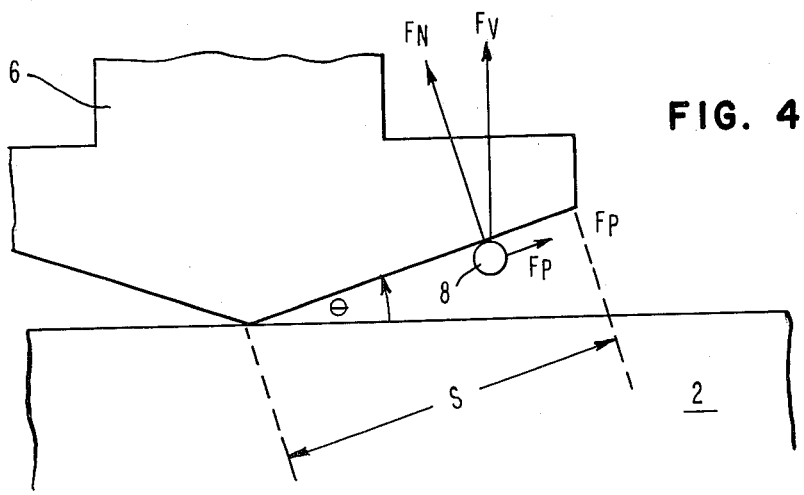
FIG. 4 is an enlarged detail of the preferred embodiment showing the forces on a void.

FIG. 4 illustrates the forces that act upon a void 8 that is in the braze (for enhanced clarity, the braze is not shown in FIG. 4) between the pin 6 and the substrate 2. While the braze is in its molten state, there will be a buoyant force $F_v$ that is pushing up on the void 8. That force can be regarded as having two components, $F_N$ normal to the surface of pin 6 and $F_P$ parallel to the surface of pin 6. While the braze is in its molten state, these forces will tend to push the void 8 along the surface of pin 6 and out from under the pin. The buoyant forces on the void will cause it to move out at a velocity $$V = \frac{2}{9}\left(\frac{gr\rho}{\mu}\right)\sin\theta$$

where:
g = acceleration due to gravity, 980 cm/sec²
r = radius of void
ρ = density of the braze
μ = viscosity of the molten braze
θ = the angle between the head of the pin and the substrate.

Thus, the radius of the smallest void which is certain to escape from between the head of the pin and the substrate in a given amount of time t is $$r_{min} = \left[\frac{9}{2}\left(\frac{\mu S \cosecant\ \theta}{t\rho g}\right)\right]^{\frac{1}{2}}$$

where S = the distance from the apex of the pin head to the outer extremity of the pin head.

Given a system in which the distance S is 0.05 cm, the angle θ = 15°, the braze is an 80/20 mixture of Au/Sn (μ = 0.05 poise and ρ = 15 g/cm³) and t = 10 minutes (the approximate time during which the braze will remain molten after having been heated to 280° C.) then $r_{min}$ = 1 μm. This means that one can be fairly certain that substantially all voids having a radius larger than 1 micron will escape from between the pin head and the substrate. (For example, a void having a radius of 2 microns would take about 2.5 minutes to escape if it started at the apex of the pin head.) Of course, even smaller voids will escape if they start away from the apex.

Those skilled in the art will, of course, recognize that the pin head need not necessarily be conical in shape. For example, it could be shaped like a wedge, a pyramid or a chisel or even be spherical in shape. It could also have a portion of its head flattened if a larger area of contact between the pin and the substrate were desired.

Another variation would be to shape the pin head in such a manner that the angle between it and the substrate varies. The greatest angle could be used in portions where voids are likely to be most detrimental. The larger angle would cause voids to move away most quickly in this area.

In yet another variation of the invention, the head of the pin need not be in direct contact with the substrate. However, in the preferred embodiment, we prefer that direct contact be made because this will generally simplify the manufacturing process by eliminating any need to maintain a specific distance between the pin head and the substrate.

The primary and most essential part of this invention is that a very substantial portion of the surface of the pin head that faces the substrate be at an angle to the substrate so that buoyant forces within the molten braze will cause voids to move out from between the pin head and the substrate.

The most significant advantage of this invention is that its use will reduce the number and total volume of voids in the braze material between a pin head and a substrate, thus increasing the mechanical strength of the braze and making it less prone to failure.

Another advantage of the preferred embodiment of the invention is that, because the pin head is placed in direct contact with the substrate, there are no critical spaces to maintain between the pin and the substrate.

Still another advantage of the invention, which further enhances the mechanical strength of the braze is that the pin head itself, because it goes completely through the braze material and contacts the substrate, can form a mechanical barrier to propagation of some cracks within the braze. Cracks which in the prior art would have propagated completely through the braze between the pin and the substrate may, in embodiments utilizing this invention, be intercepted by the pin itself and thus be prevented from propagating through the braze.

Another significant advantage to this invention is its simplicity of implementation. No substantial changes to an existing process will generally be required except for a change in the shaping of the pin head.

The angle θ and length S of the pin head will depend upon the braze that is used and the desired minimum radius of voids for which escape will be assured. The specific details of implementation of the invention into any existing manufacturing process are well within the knowledge of those skilled in the art in light of the above detailed description.

While we have illustrated and described preferred embodiments of the invention, it is to be understood that we do not limit ourselves to the constructions herein disclosed and the right is reserved to all changes and modifications coming within the scope of the invention as defined in the appended claims.

Having thus described our invention, what we claim as new, and desire to secure by Letters Patent is:

1. As an article of manufacture, a substrate and a pin, one end of said pin being brazed to said substrate by a brazing material having a brazing temperature significantly below the melting point of said pin,
said one end of said pin having a substantial portion of its surface at an angle with respect to a plane perpendicular to the axis of the pin;
said angle being equal to or larger than an angle θ which satisfies the relationship $$r = \left[\frac{9}{2}\left(\frac{\mu S \cosecant\ \theta}{t\rho g}\right)\right]^{\frac{1}{2}}$$

where:
r = the radius of the smallest void for which escape is desired to be reasonably certain,
μ = viscosity of the molten braze,
ρ = density of the braze,
g = acceleration due to gravity,
t = time during which the braze will remain in a molten state, and
S = maximum distance of travel by a void in order for it to escape from the braze between the end of the pin and the substrate;
whereby it is reasonably certain that the brazing material which joins said pin to said substrate will contain no voids having a radius equal to or greater than r.

2. A pin, one end of which will be fixed to a substrate by a braze, at a temperature significantly below the melting point of said pin,
said one end having a substantial portion of its surface at an angle with respect to a plane perpendicular to the axis of the pin;

said angle being equal to or larger than an angle $\theta$ which satisfies the relationship $$r = \left[\frac{9}{2}\left(\frac{\mu S \text{ cosecant } \theta}{tpg}\right)\right]^{\frac{1}{2}}$$

where:
- $r$ = the radius of the smallest void for which escape is desired to be reasonably certain,
- $\mu$ = viscosity of the molten braze,
- $p$ = density of the braze,
- $g$ = acceleration due to gravity,
- $t$ = time during which the braze will remain in a molten state, and
- $S$ = maximum distance of travel by a void in order for it to escape from the braze between the end of the pin and the substrate;

whereby it is reasonably certain that the braze which will fix said pin to a substrate will contain no voids having a radius equal to or larger than $r$.

* * * * *